United States Patent [19]

Silvio et al.

[11] Patent Number: 4,937,573
[45] Date of Patent: Jun. 26, 1990

[54] VARIABLE LENGTH CODE AND DEVICES FOR HIGH FREQUENCY TRANSMISSION

[75] Inventors: Cucchi Silvio, Gaggiano; Corradi Vittorio, Monza; Capriata Stefano, Milan, all of Italy

[73] Assignee: Telettra Telefonia Elettronica e Radio SpA, Milan, Italy

[21] Appl. No.: 117,749

[22] Filed: Nov. 4, 1987

[30] Foreign Application Priority Data

Nov. 4, 1986 [IT] Italy .................. 22223 A/86

[51] Int. Cl.⁵ .............................. H03M 7/40
[52] U.S. Cl. ...................... 341/67; 341/59; 358/261.1
[58] Field of Search ............ 341/50, 51, 59, 60, 341/67, 76, 107; 358/260, 261, 263

[56] References Cited

U.S. PATENT DOCUMENTS 4,302,775 11/1981 Widergren et al. ............ 358/136
4,394,774 7/1983 Widergren et al. ............ 382/56
4,568,983 2/1986 Bobick ........................... 358/263

Primary Examiner—William M. Shoop, Jr.
Assistant Examiner—Brian K. Young
Attorney, Agent, or Firm—Ostrolenk, Faber, Gerb & Soffen

[57] ABSTRACT

A variable-length prefix/suffix step code is combined with words for high frequency transmission. The words with the code attached are compacted into constant length packets at the transmission end and are successively extracted at the receive end. The code permits the two operations of extraction and decoding to be separated at the receive end; this is essential in high speed applications where these operations cannot be performed simultaneously within one clock cycle. The code also permits the extraction operation to be simplified by considerably reducing the size of the necessary hardware. The efficiency of processing messages with a particular probability distribution (e.g. video signals) is very high (97-98%).

5 Claims, 21 Drawing Sheets

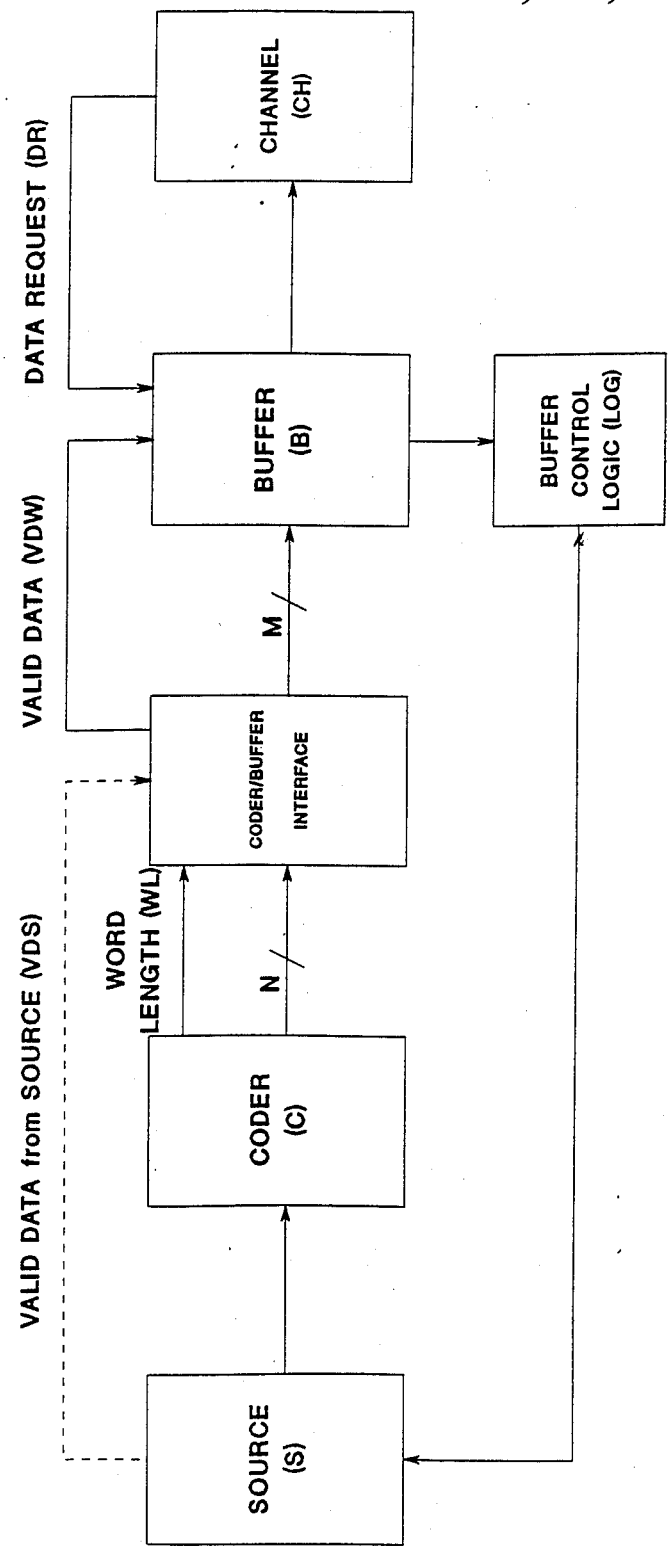

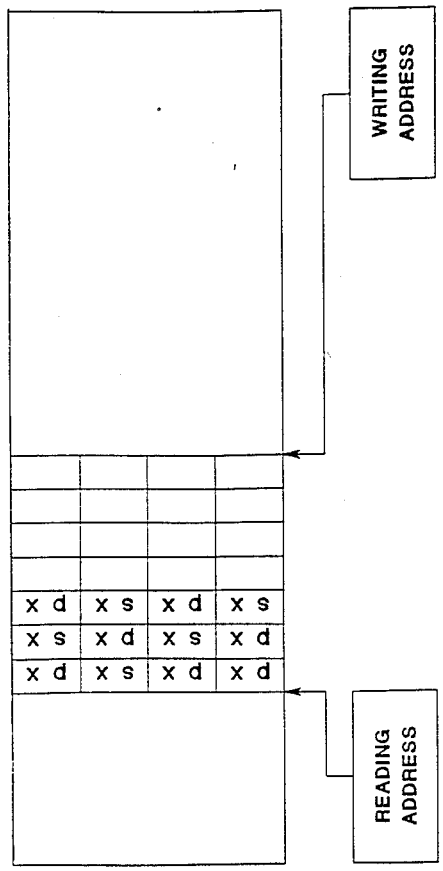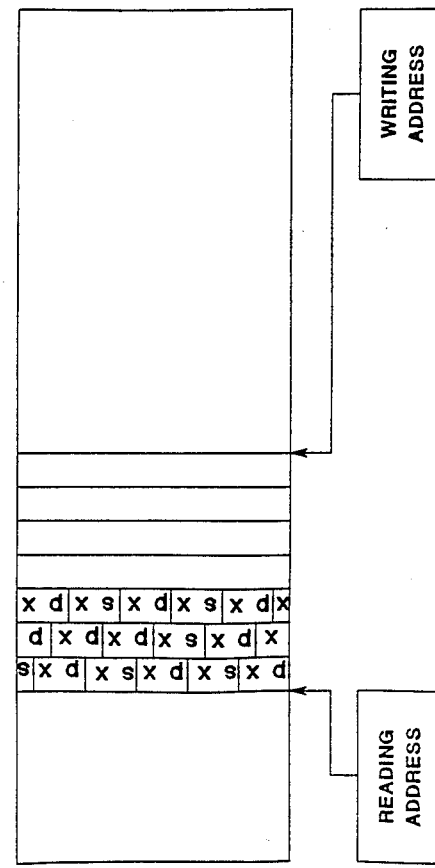

FIG. 8b(CONT.1)
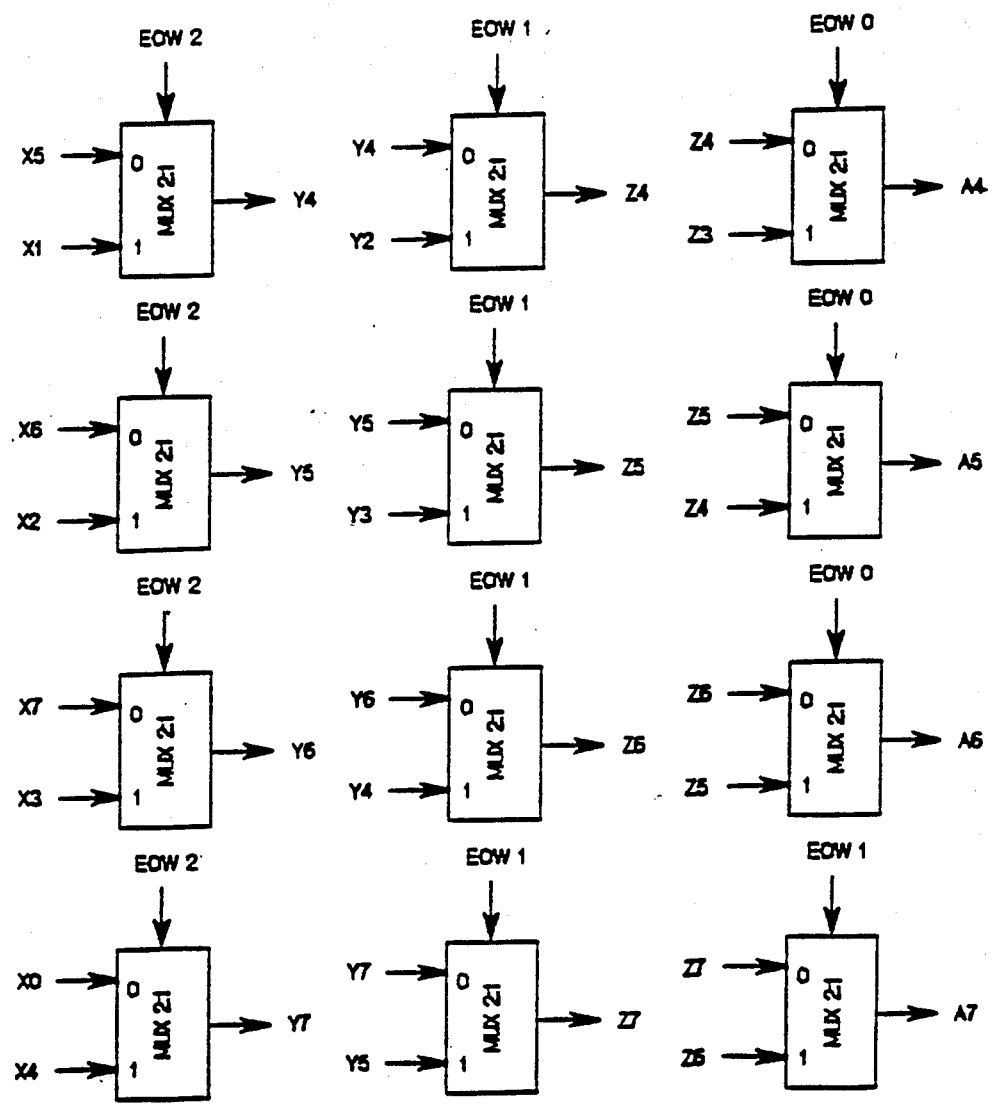

FIG. 8b(CONT.2)

| IN | | | OUT | | | | | | | | |
|---|---|---|---|---|---|---|---|---|---|---|---|
| EOW2 | EOW1 | EOW0 | A0 | A1 | A2 | A3 | A4 | A5 | A6 | A7 |
| 0 | 0 | 0 | X1 | X2 | X3 | X4 | X5 | X6 | X7 | X0 |
| 0 | 0 | 1 | X2 | X3 | X4 | X5 | X6 | X7 | X0 | X1 |
| 0 | 1 | 0 | X3 | X4 | X5 | X6 | X7 | X0 | X1 | X2 |
| 0 | 1 | 1 | X4 | X5 | X6 | X7 | X0 | X1 | X2 | X3 |
| 1 | 0 | 0 | X5 | X6 | X7 | X0 | X1 | X2 | X3 | X4 |
| 1 | 0 | 1 | X6 | X7 | X0 | X1 | X2 | X3 | X4 | X5 |
| 1 | 1 | 0 | X7 | X0 | X1 | X2 | X3 | X4 | X5 | X6 |
| 1 | 1 | 1 | X0 | X1 | X2 | X3 | X4 | X5 | X6 | X7 |

ENCB

| | | OUT | | | | | | | | | |
|---|---|---|---|---|---|---|---|---|---|---|---|
| | NO2B | 0 | 0 | 0 | 0 | 0 | 0 | 0 | 0 | 1 | |
| | ENCB 1 | 0 | 1 | 0 | 1 | 0 | 1 | 0 | 1 | 1 | |
| | ENCB 2 | 0 | 0 | 1 | 1 | 0 | 0 | 1 | 1 | 1 | |
| | ENCB 3 | 0 | 0 | 0 | 0 | 1 | 1 | 1 | 1 | 1 | |

| | IN | | | | | | | | |
|---|---|---|---|---|---|---|---|---|---|
| B0 | 0 | 1 | 1 | 1 | 1 | 1 | 1 | 1 | 1 |
| B1 | × | 0 | 1 | 1 | 1 | 1 | 1 | 1 | 1 |
| B2 | × | × | 0 | 1 | 1 | 1 | 1 | 1 | 1 |
| B3 | × | × | × | 0 | 1 | 1 | 1 | 1 | 1 |
| B4 | × | × | × | × | 0 | 1 | 1 | 1 | 1 |
| B5 | × | × | × | × | × | 0 | 1 | 1 | 1 |
| B6 | × | × | × | × | × | × | 0 | 1 | 1 |
| B7 | × | × | × | × | × | × | × | 0 | 1 |

ENCA

| | OUT | | | | | | | | |
|---|---|---|---|---|---|---|---|---|---|
| ENCA 3 | 0 | 1 | 0 | 1 | 0 | 1 | 0 | 1 | |
| ENCA 2 | 0 | 0 | 1 | 1 | 0 | 0 | 1 | 1 | |
| ENCA 1 | 0 | 0 | 0 | 0 | 1 | 1 | 1 | 1 | |

| | IN | | | | | | | |
|---|---|---|---|---|---|---|---|---|
| A0 | 1 | 0 | 0 | 0 | 0 | 0 | 0 | 0 |
| A1 | × | 1 | 0 | 0 | 0 | 0 | 0 | 0 |
| A2 | × | × | 1 | 0 | 0 | 0 | 0 | 0 |
| A3 | × | × | × | 1 | 0 | 0 | 0 | 0 |
| A4 | × | × | × | × | 1 | 0 | 0 | 0 |
| A5 | × | × | × | × | × | 1 | 0 | 0 |
| A6 | × | × | × | × | × | × | 1 | 0 |
| A7 | × | × | × | × | × | × | × | 1 |

|     | DEC OUT |   |   |   |   |   |   |   |   | IN |   |   |
|-----|---------|---|---|---|---|---|---|---|---|---|---|---|

| | | | | | | | | |
|---|---|---|---|---|---|---|---|---|
| D0 | 1 | 1 | 1 | 1 | 1 | 1 | 1 | 1 |
| D1 | 0 | 1 | 1 | 1 | 1 | 1 | 1 | 1 |
| D2 | 0 | 0 | 1 | 1 | 1 | 1 | 1 | 1 |
| D3 | 0 | 0 | 0 | 1 | 1 | 1 | 1 | 1 |
| D4 | 0 | 0 | 0 | 0 | 1 | 1 | 1 | 1 |
| D5 | 0 | 0 | 0 | 0 | 0 | 1 | 1 | 1 |
| D6 | 0 | 0 | 0 | 0 | 0 | 0 | 1 | 1 |
| D7 | 0 | 0 | 0 | 0 | 0 | 0 | 0 | 1 |
| EOW0 | 0 | 1 | 0 | 1 | 0 | 1 | 0 | 1 |
| EOW1 | 0 | 0 | 1 | 1 | 0 | 0 | 1 | 1 |
| EOW2 | 0 | 0 | 0 | 0 | 1 | 1 | 1 | 1 |

FIG. 9c

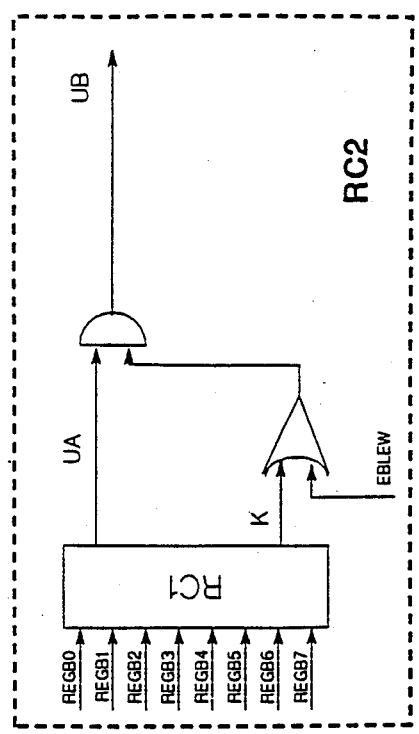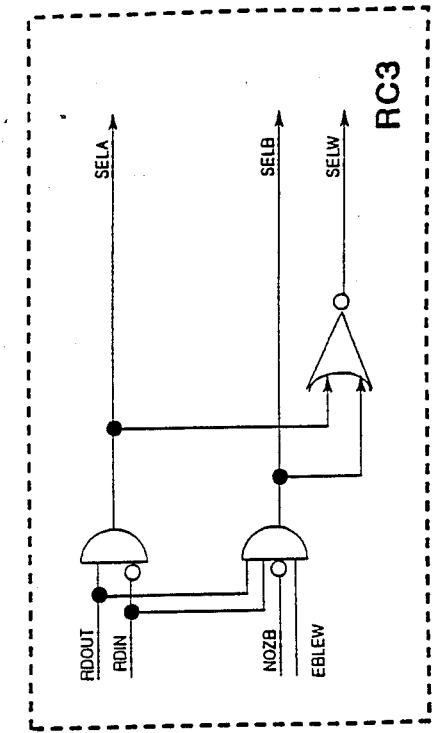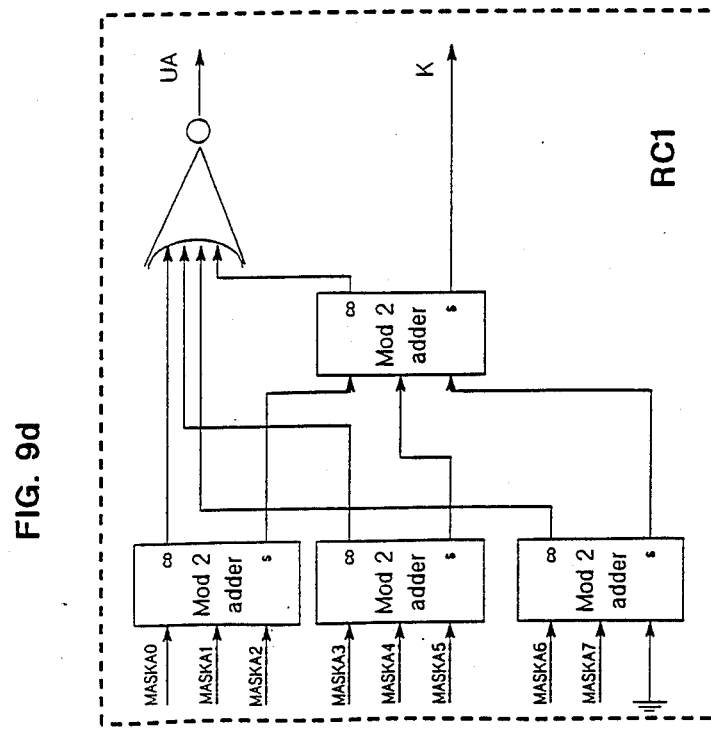
FIG. 9d
FIG. 9d (CONT.1)
FIG. 9d (CONT.2)

FIG. 9e (CONT.1)
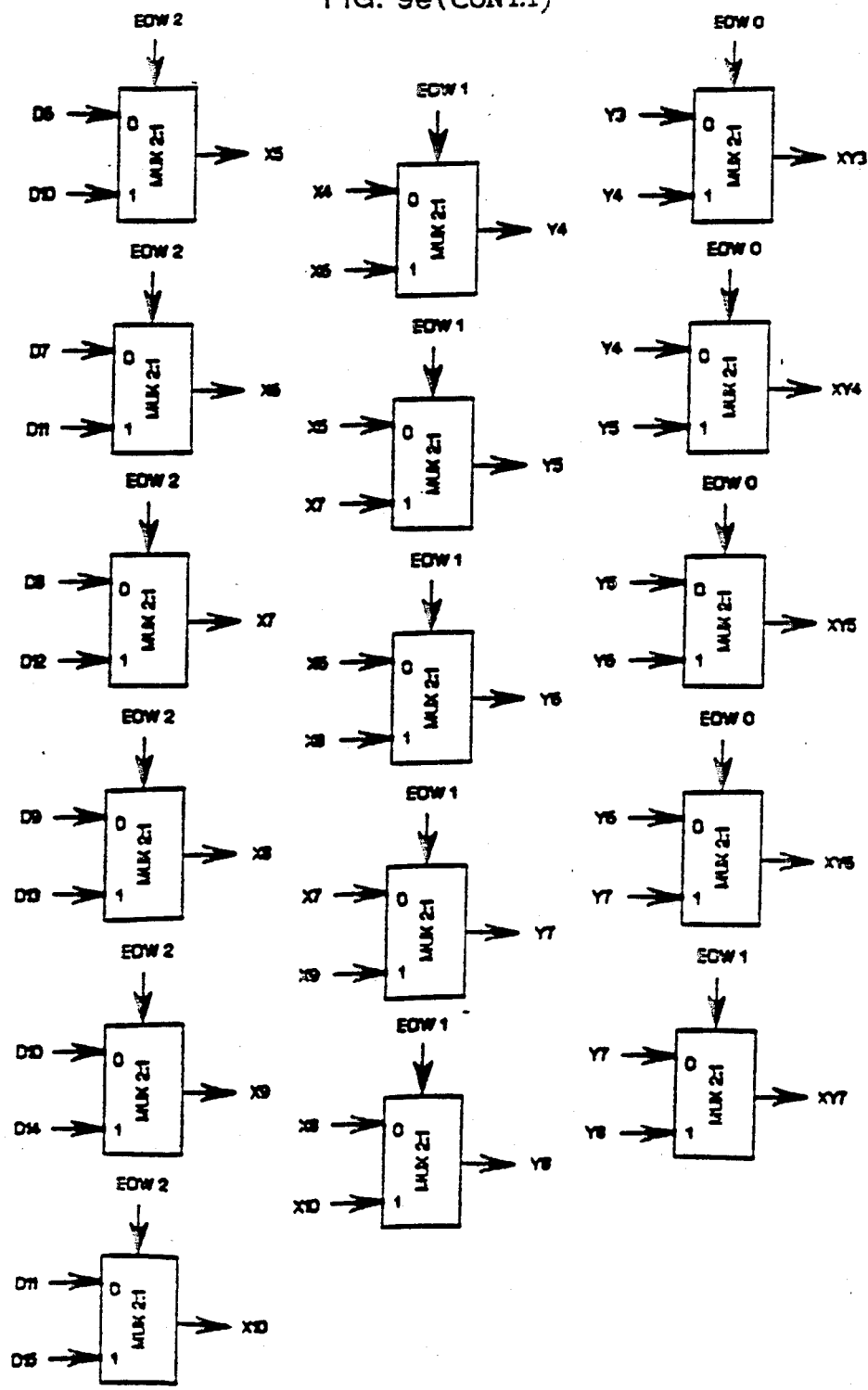

FIG. 9e (CONT.2)

| IN | | | OUT | | | | | | | | |
|---|---|---|---|---|---|---|---|---|---|---|---|
| EOW2 | EOW1 | EOW0 | XY0 | XY1 | XY2 | XY3 | XY4 | XY5 | XY6 | XY7 | |
| 0 | 0 | 0 | XY0 | XY1 | XY2 | XY3 | XY4 | XY5 | XY6 | XY7 | |
| 0 | 0 | 1 | D1 | D2 | D3 | D4 | D5 | D6 | D7 | D8 | |
| 0 | 1 | 0 | D2 | D3 | D4 | D5 | D6 | D7 | D8 | D9 | |
| 0 | 1 | 1 | D3 | D4 | D5 | D6 | D7 | D8 | D9 | D10 | |
| 1 | 0 | 0 | D4 | D5 | D6 | D7 | D8 | D9 | D10 | D11 | |
| 1 | 0 | 1 | D5 | D6 | D7 | D8 | D9 | D10 | D11 | D12 | |
| 1 | 1 | 0 | D6 | D7 | D8 | D9 | D10 | D11 | D12 | D13 | |
| 1 | 1 | 1 | D7 | D8 | D9 | D10 | D11 | D12 | D13 | D14 | |
| | | | D8 | D9 | D10 | D11 | D12 | D13 | D14 | D15 | |

VARIABLE LENGTH CODE AND DEVICES FOR HIGH FREQUENCY TRANSMISSION

BACKGROUND OF THE INVENTION

1. Field of the Invention

The invention relates generally to variable length code words for high frequency digital transmission systems and, more particularly, to a system which compacts variable length code words at the transmission end into constant length packets and successively extracts them at the reception end.

2. Description of the Related Art

In order to obtain information about word length it was, up to now, necessary to analyze at least 2*N bits, where N was the maximum length of the particular variable-length code. In cases involving length codes of considerable maximum length, the implementing hardware was very complex and had to operate at very high frequencies.

SUMMARY OF THE INVENTION

The object of the present invention is to provide a system which extracts word length (WL) information by examining a minimum number of bits, the bits contain the desired word length information.

The system of the present invention utilizes a "prefix/suffix step code" ([px. .]sx), in which each word W begins with a sequence of a variable number n ($0 <= n <= N/ST$) of prefixes (where N=maximum code length; ST=step (prefix or suffix) length) and ends a single suffix, whose function is to signal the end of the word. The only exception to this rule is for words having the maximum code length. In such a case, a fixed parameter of the code extraction algorithm at the receive end simply assumes WL=N. Both prefixes and suffixes are convenient combinations of bits of fixed length ST referred to as "steps". Any word length will be a multiple of the step length ST.

The device for implementing this special code has, at the transmission end, a "word compacter" (WC) inserted as an interface between a coder (C) and a buffer (B). This circuit is capable of receiving variable length words (with maximum length N) from the coder (C), temporarily storing them, and transmitting packets (P) of fixed length (M) to the buffer (B), thus operating at a peak frequency N/M*Fs (where Fs is the peak source frequency). At the receive end, the opposite operation is accomplished by a special circuit called a "word expander".

As a consequence of utilizing the above-described code with the above-described hardware, a dramatic increase in operating speed is obtained.

BRIEF DESCRIPTION OF THE DRAWINGS

These and other features and advantages of the invention will become apparent when the following text is read in conjunction with the accompanying drawings, in which:

FIG. 4 is a block diagram showing the parallel compacting of words;

FIGS. 6a and 6b, respectively, show the formatting of information in the case where M is a multiple of ST and in the case where M is not a multiple of ST;

FIGS. 8a, 8b, and 8c are, respectively, an example of circuitry for implementing the word compacter, the combining network "ROT" and accompanying I/O table, and the combining networks "DEC" and "FDEC" I/O table; FIGS. 9b, 9c, 9d, and 9e are, respectively, examples of implementations of the combining networks "ENCA", "ENCB" I/O tables, the combining networks "DEC" I/O table, the combining network "RC1", RC2" and RC3", and the combining network "ROT" hardware and accompanying I/O table.

DETAILED DESCRIPTION OF THE PREFERRED EMBODIMENT

Figure 1A:
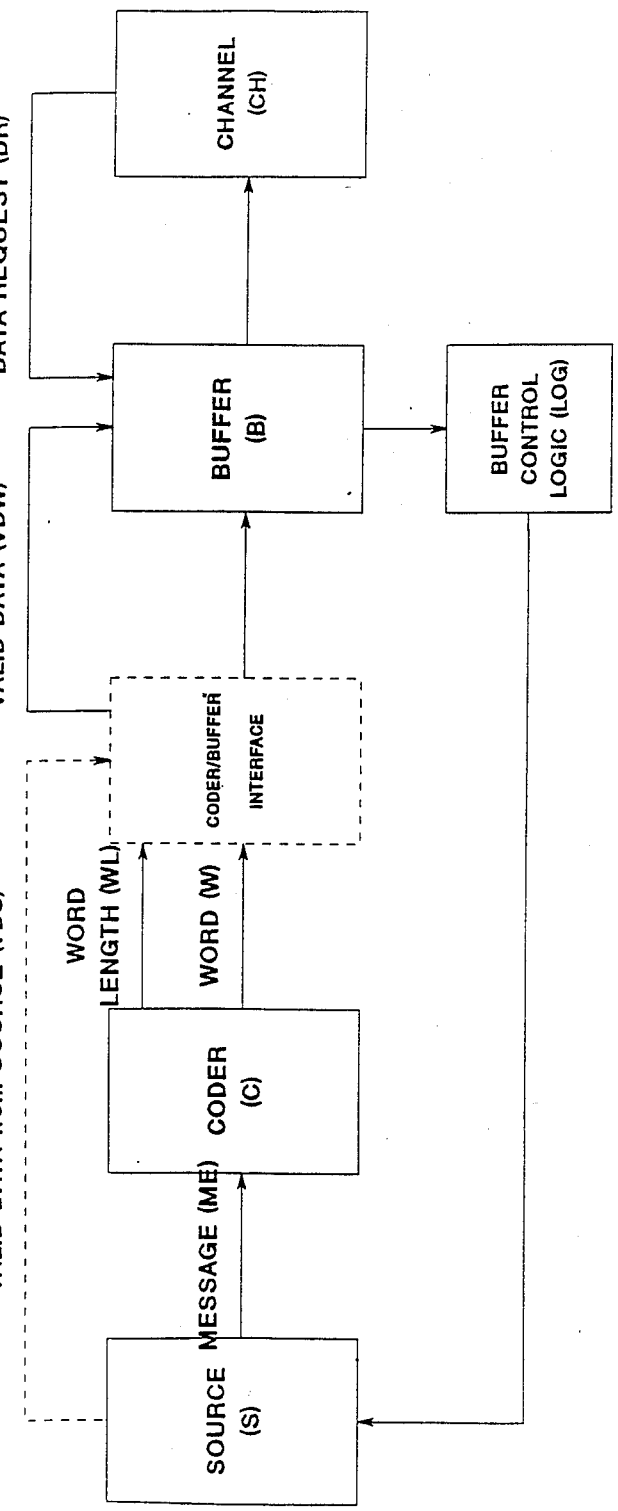
FIG. 1a is a block diagram of a typical prior art transmission system and FIG. 1b is a simplified sketch of a sequence of code words in accordance with the invention.

In order to better focus on the problem to which the present invention is directed, reference is first made to the block diagram of FIG. 1a. Examining the diagram from left to right, we have the following functional blocks:

(1) Source (S) transmits messages (Me) with a certain probability distribution; this transmission may be either at a constant or at a variable frequency (in this second case, an auxiliary signal called "valid data from source" (VDS) is needed), with a certain peak source frequency (Fs).

(2) Coder (C) translates the messages (Me) into words (W) belonging to a certain code which may have either a constant or a variable length, with a maximum code length (N). It is often convenient to make use of a variable length code; in fact, by adapting the code to the probability distribution of the messages (Me) coming from source (S), a considerable bit rate saving may be obtained. Coder (C) is nothing but a transcoding table, i.e. a "slave circuit" with respect to source (S), the coder frequency always being equal to the frequency of the source, and its peak frequency (Fc) always being equal to the peak source frequency (Fs).

(3) Buffer (B), interfaces the variable speed information generation, generally due both to the variable transmission frequency of source (S) and to the use of a variable length code, with a so-called channel (CH), which accepts information at a constant rate (Fch).

(4) Buffer control logic (LOG), whose function is to provide feedback to alter the emitting frequency of source (S) based upon the amount of data in buffer (B). For example, whenever buffer (B) becomes too full, the feedback forces source (S) to decrease the bit rate of the messages (Me), hence the source signal quality.

Figure 3:
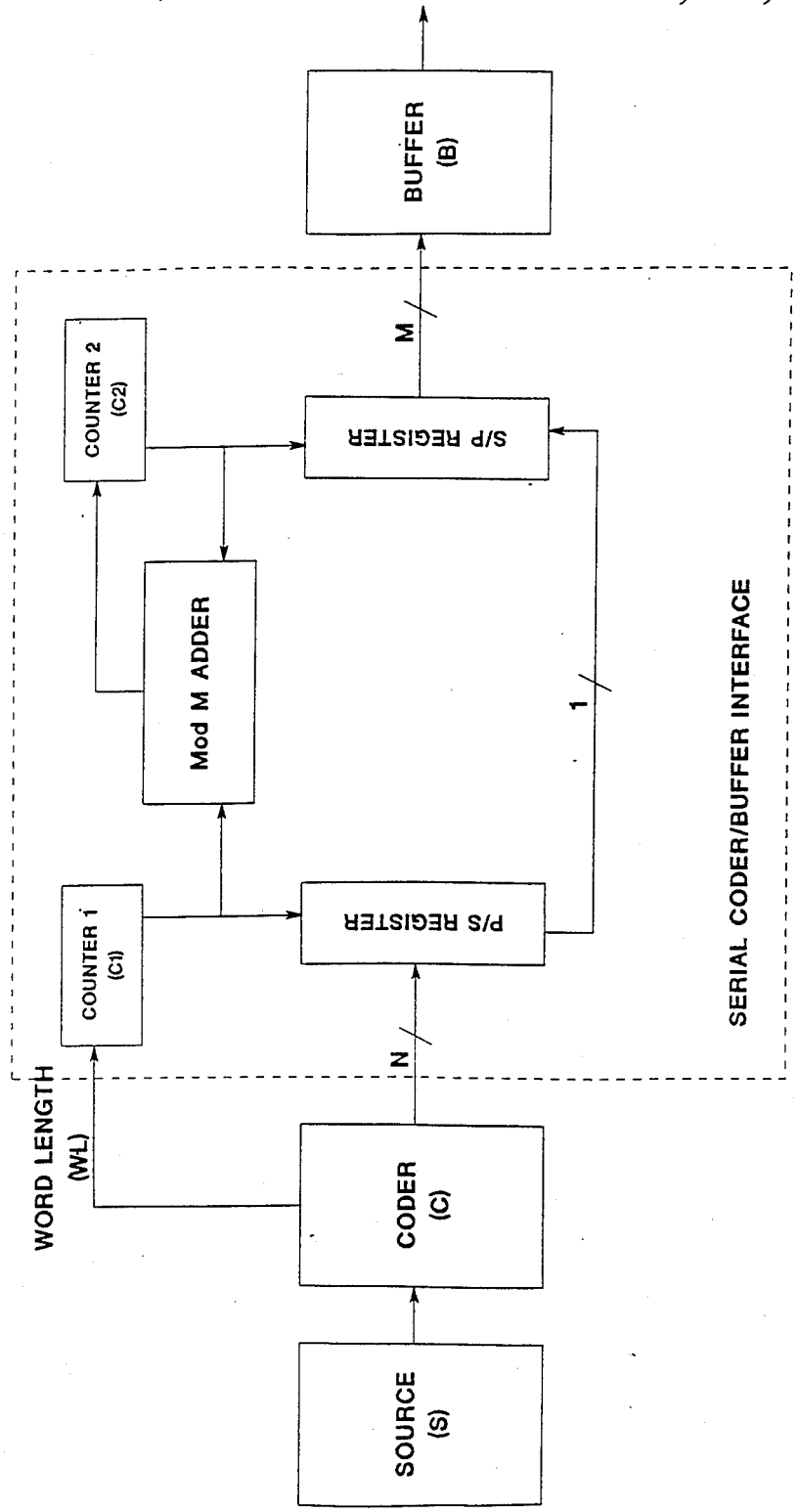
FIG. 3 is a block diagram showing the serial compacting of words.

(5) The dotted block, referred to as "coder/buffer interface", functions to change the incoming information format to the buffer (B) dimensions. There are two possible choices:

(i) Parallel-to-serial conversion (P/S) and subsequent serial buffering of the variable length words (W) supplied by the coder (C), referred to as "serial mode" (See FIG. 3).

(ii) Compacting the variable length words (W) supplied by the coder (C) into constant length (M) packets (P) and subsequent parallel buffering, referred to as "parallel mode" (see FIG. 4). Actually, this solution is a general one, comprising solution (i) in the case of a unitary packet length (M=1). The circuit providing this kind of processing will be referred to as "word compacter" (WC) and is, along with its corresponding receiving circuit ("word expander WE) providing the opposite function, the implementing device of the present invention.

Figure 2A:
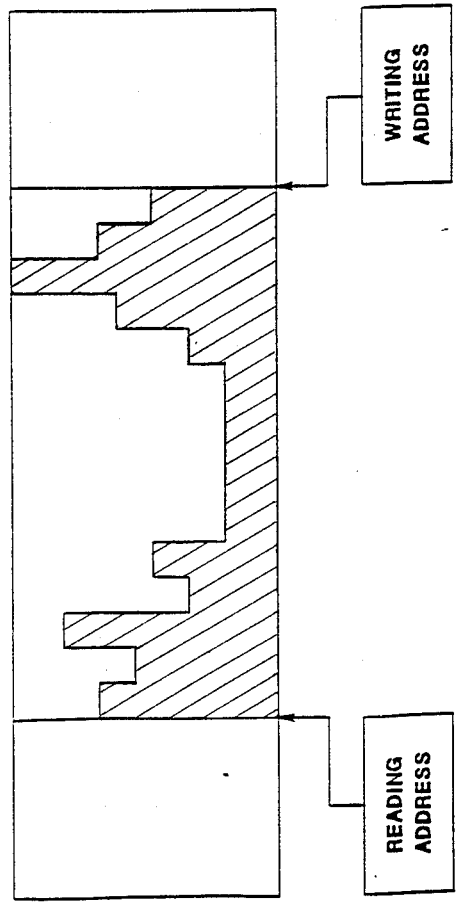
FIGS. 2a and 2b are diagrams showing, respectively, a buffer containing non-compacted data and a buffer containing compacted data.
Figure 2B:
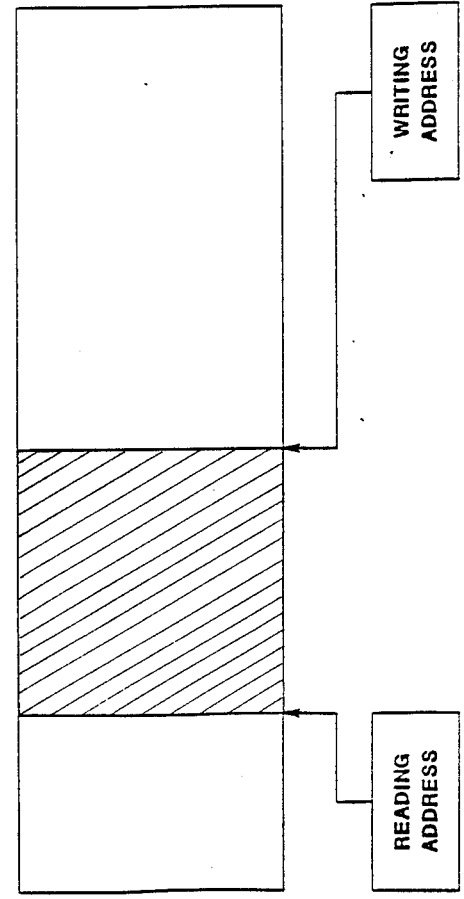

The operation of compacting words into packets is necessary for two reasons; the first is that, by not doing so, the buffer would fill up too quickly, causing through the described feedback a useless deterioration of the source signal (compare the buffer containing non-compacted data shown in FIG. 2a with the buffer containing compacted data shown in FIG. 2b); the second is that otherwise the channel (CH) occupation rate would be N*Fs anyway, thus offsetting, if not worsening, the advantage of a suitable variable-length coding.

But why is it necessary to use the parallel mode at certain times?

The serial mode is suitable for low speed sources (S); in fact, parallel-to-serial conversion creates a peak speed increase (a critical parameter in the system design) from Fs to N*Fs, where N is the maximum length code: if the original Fs is not low enough, it is easy to reach very high peak frequencies.

For instance, when Fs=27 Mhz (the frequency of a video signal with components YUV=4:2:2) and N=8→peak system frequency N*Fs=216 Mhz, i.e. the clock cycle is less than 5 ns!

In this case, a parallel mode solution is preferred: by utilizing packets (P) of convenient length M the peak frequency decreases to N/M*Fs, which is attainable with the presently available circuitry. These packets must be prepared by an appropriate word compacting (WC) circuit, which, in order to operate correctly, should know the word length (WL) of the incoming words to be compacted. This information may be supplied directly by the coder (C) in parallel with the words.

Much worse implementation problems, without an appropriate code, would arise at the receive end, where, when receiving just constant length (M) packets, a word extracter (WE) circuit would supply the corresponding decoder (D) without knowing the length (WL) of the next word to be extracted.

Figure 5A:
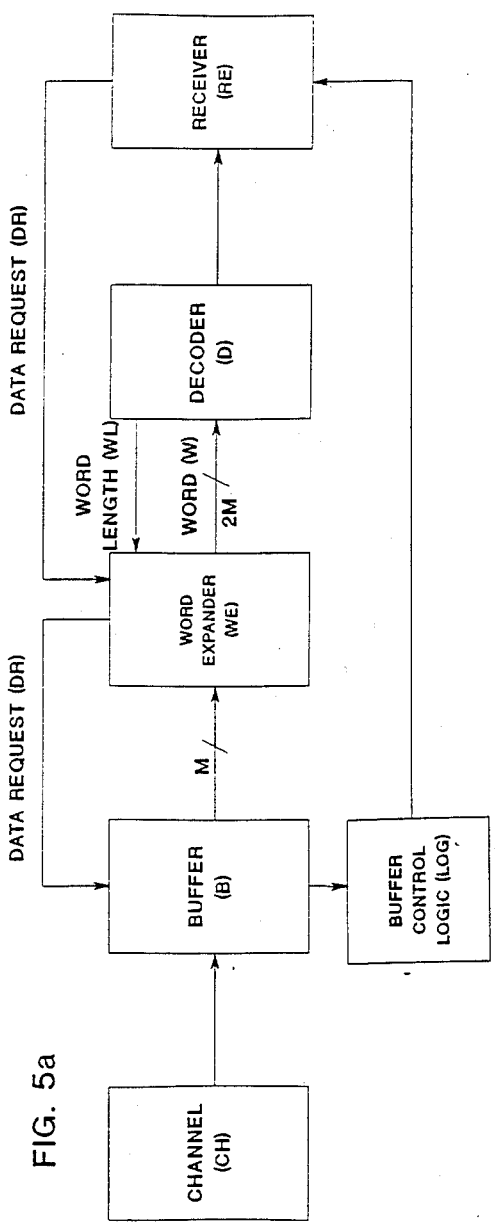
FIGS. 5a and 5b show, respectively, the receive end with paralleling in the case of a general variable length code and the receive end with paralleling in the case of [px . . . ]sx variable length code.

In this case, it would be necessary to wait until the decoder (D), examining at least 2*N bits (thus needing large decoding tables), recognizes the next word and consequently sends back the corresponding word length (WL) necessary to provide correct operation of extraction (FIG. 5a). This ring might cause an intolerable delay, thus making the solution impraticable.

Figure 5B:
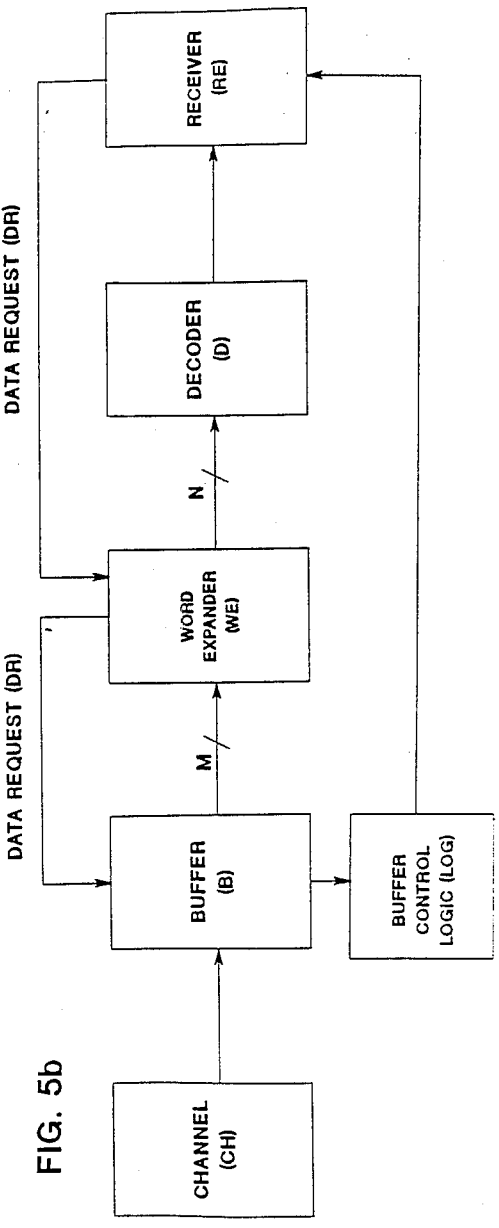

A practical solution is to utilize a convenient variable length code intrinsically containing the desired information about the word length (WL), thus permitting the receive end to logically and physically separate the extracting an decoding operations (FIG. 5b) and to connect them in cascade. The code described in this invention, prefix/suffix (or briefly [px . . . ]sx) code meets this requirement.

Figure 1B:
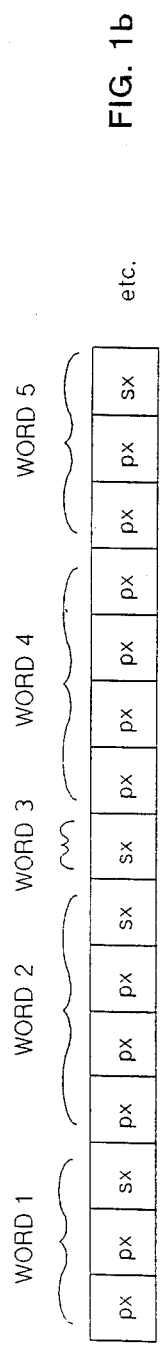

The structuring of the so-called "prefix/suffix step code" ([px . . . ]sx) is that each word W belonging to it is composed of a sequence of variable number n (0<=-n<=N/ST) of prefixes px (where N=maximum code length, ST=step (prefix or suffix) length ending with a single suffix sx whose function is to signal the end of the word (FIG. 1b).

There is an exception to this rule only for words having the maximum code length (in this case, N being a fixed parameter of the code, the extraction algorithm at the receive end simply assumes WL=N). Thus, in FIG. 1b, since word 4 does not have a suffix sx, the maximum code length must be 4 steps.

Both prefixes and suffixes are convenient combinations of bits of fixed length ST referred to as "steps": it is evident that any word length will be a multiple of the step length ST.

At the receive end, in order to determine the length (WL) of the word to be extracted, it is sufficient to determine the position of the next suffix in the sequence of incoming packets; in the case of a sequence of N/ST prefixes, the extracting algorithm assumes WL=N.

(The use of maximum length N without suffix could be useful in order to expand the set of possible messages to be sent).

A further reduction of hardware (WC/WE circuits) complexity occurs when the packet length M is a multiple of the step length ST, simultaneously satisfying of the following two requirements:

$$WL=n*ST(1<=n<=N/ST); \quad (1)$$

$$M=m*ST(1<=m<=M/ST). \quad (2)$$

In other words, the step length ST must be a submultiple of the packet length M (often a given parameter). For instance, if M=16, the following choices are possible: ST=1, 2, 4, 8, giving rise to four possible [px . . . ]sx step codes.

If we chose the step length ST=2, all the code words would be formed by combining the following four steps: s1=00, s2=01 s3=10 s4=11. A few of them might be chosen as prefixes (px), the other ones as suffixes (e.g. sx=[S1,S2]px=[S3,S4]); in this case, it is immediately evident that the distinction between px and sx is determined by the value of the first bit; only 50% of the bits (even or odd according to convention) contain the word length information, this category of bits is referred to hereinafter as "ps bits", while the other is referred to hereinafter as the "px bits" or more generally "x bits".

So, if M=16 the word extracter (WE) will simply separate the 8 ps bits from the remaining x bits and then easily extract the word length information based upon their configuration.

The logic separation between ps and x bits can also be exploited at the transmit end, generating either the ps bits from the word length information provided by coder (C) or, conversely, computing the word length information from the ps bits in order to correctly compact the word.

In any case, the x bits, during both compacting/extracting operations, are passive, in that their evolution depends only on the information contained in the ps bits stream.

Simultaneous satisfactions of conditions (1) and (2) allows the bit position (phase) to always be the same the incoming packets (FIG. 6a); when this is not accomplished, it results into a continuous phase shift of ps bits, thus compelling the use of a complex extracting algorithm (FIG. 6b).

Figure 7A:
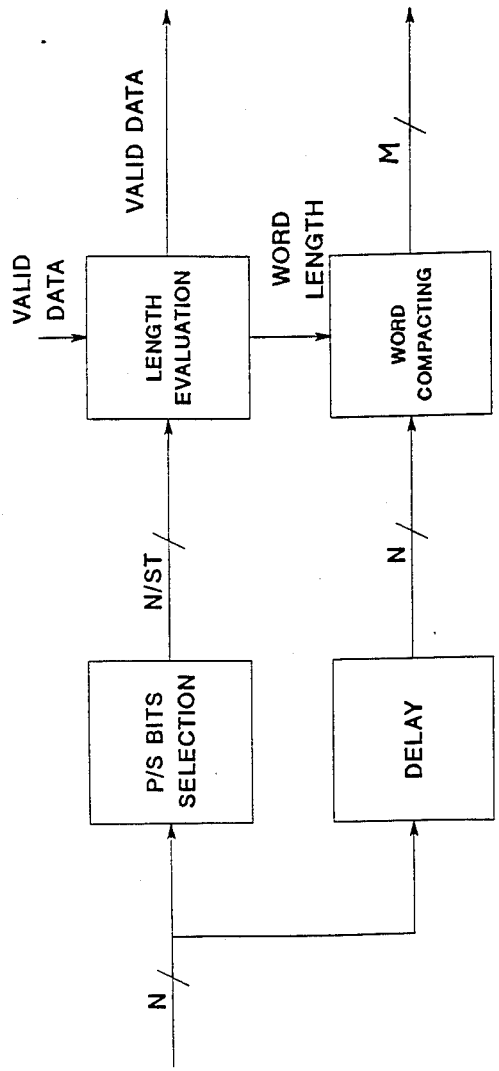
FIGS. 7a and 7b are, respectively, block diagrams of a word compacter and word expander circuits.

FIG. 7a shows a practical example of how to implement a WC operation: the "length evaluation" circuit is a simple combining network which looks only at N/ST bits, a convenient delay sufficient to compact the corresponding word.

Figure 7B:
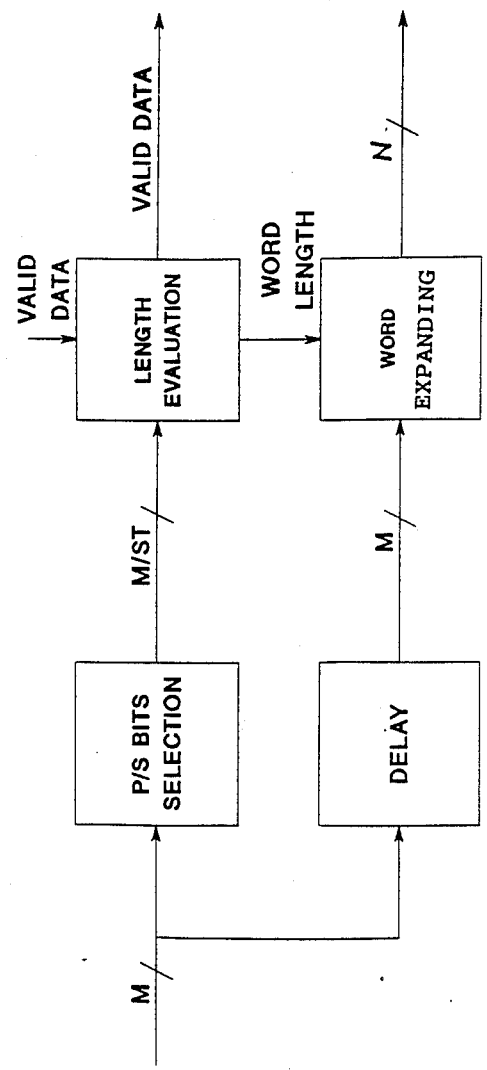

FIG. 7b shows an analogous practical example of how to implement a WE operation: the length evaluation circuit is still a simple combining network which looks, in this case, at only 2*M/ST bits, a convenient delay being sufficient to extract the corresponding word.

Example of Hardware Implementation

Under the assumption that indefinite prefix/suffix step codes are possible and in view of the fact that here further attention cannot be dedicated to the theory, an analysis is given of the implementation of the two devices: the word compacter (WC) and word expander (WE) in the case N=M=16, ST=2, in which maximum length words without a suffix are allowed.

In the electrical diagrams, conventional symbols have been used; an ad-hoc combining network is described using logic tables: in any case, the analysis is shown in such a way that any skilled person may easily utilize the data in order to simulate the described functions.

The word compacter

As already stated, two choices are possible to accomplish the word compacting operation:

(1) Input the word compacter with the complete variable-length px/sx step code and successively compute the length information through a combining network (as illustrated in FIG. 7a).

(2) Input the word compacter with the x bits and, in parallel, complete the word length information and successively compute the ps bits through a combining network.

Figure 8A:
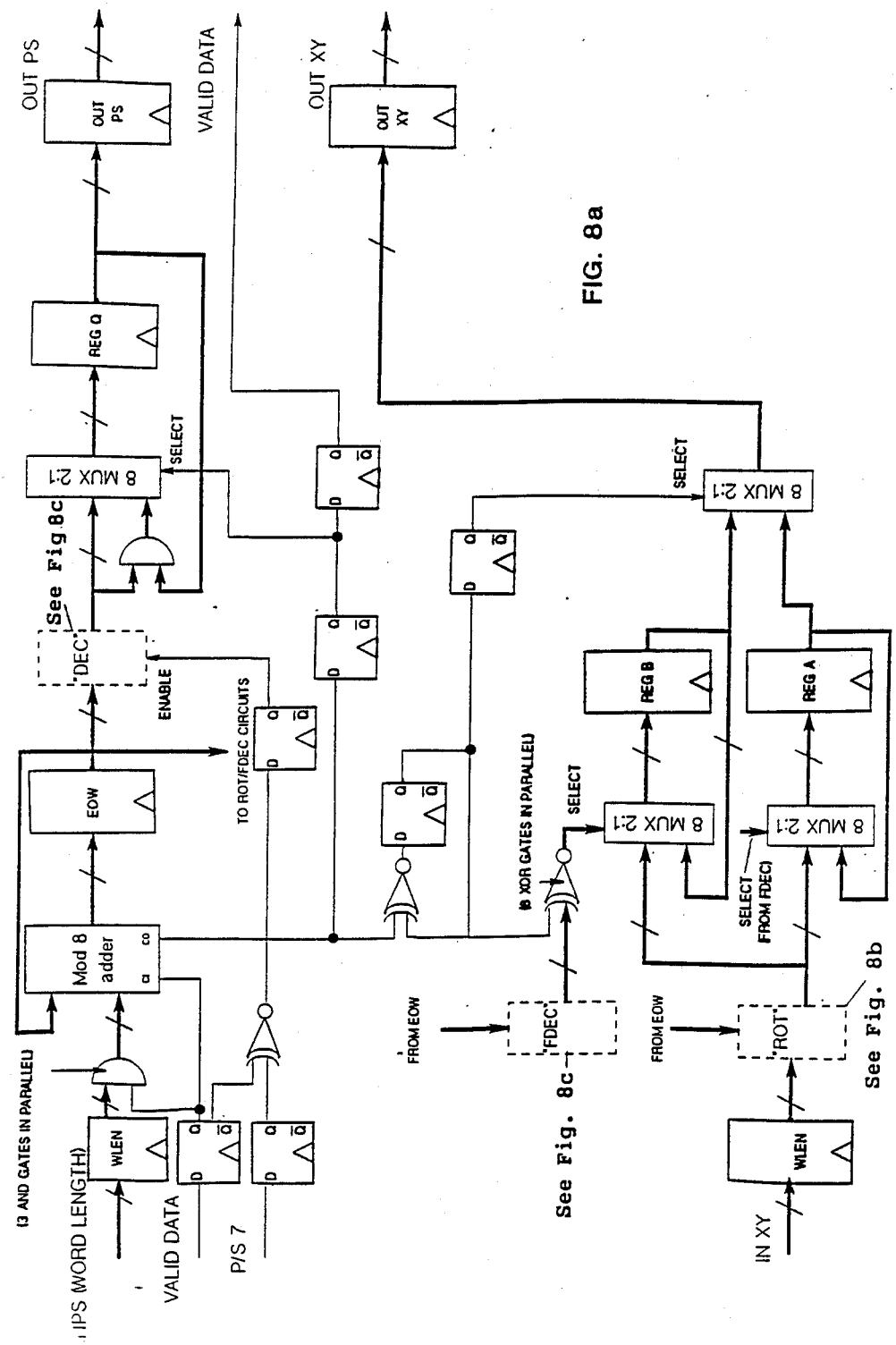

The electrical diagram (in the case N=M=16, ST=2) shown in FIG. 8a adopts the second solution, chosen in that it permits minimization of the output coder bits (12 instead of 16).

The input bits have the following meaning:

8 x bits (INXY)
3 bits (INPS) containing the word length information (WLEN)
1 auxiliary bit (P/S7)

in addition to the VALID DATA bit, which is supplied by source (S) bypassing coder (C) because the information rate is not constant.

The purpose of the auxiliary bit called P/S7 is to specify, in the case of maximum word length N=16, whether the last portion of word W is a prefix px or a suffix sx.

The length of the words is mapped according to the algorithm:

```
                WLEN = n/2 − 1
i.e. if  n = 2   →   WLEN = 0 [000]
         n = 4   →   WLEN = 1 [001]
         ......      ..............
         n = 16  →   WLEN = 0 [111]
```

The circuitry shown in FIG. 8a (and also in FIGS. 9aa and 9ab) is represented with standard symbols, among which:

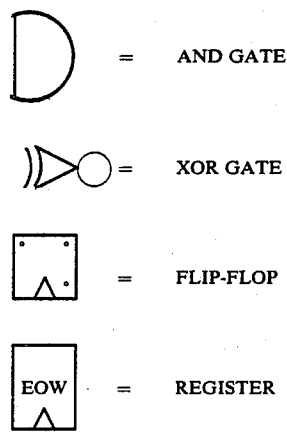

```
     = AND GATE

= XOR GATE

= FLIP-FLOP

EOW  = REGISTER
```

The general operation of the circuitry is as follows:

The upper part of the circuitry shown in FIG. 8a is the so-called "ps side" which, besides updating the EOW counter, also determines the ps bits to be sent to the output through a combining network DEC (FIG. 8c). The VALID DATA output bit is determined directly by the carry out of the modulus 8 adder updating the EOW counter; it is used also to decide whether to recirculate the contents of REGQ or not.

Whenever the carry out=1, it means that a packet has been filled and is ready to be sent to buffer (B) downstream.

The lower part of the circuitry is the so-called "x side" which receives four bits (three of which are EOW) from the above-mentioned ps side; The fourth is the VALID DATA signal, used to select the register (REGA or REGB) to be sent as output).

Figure 8B:
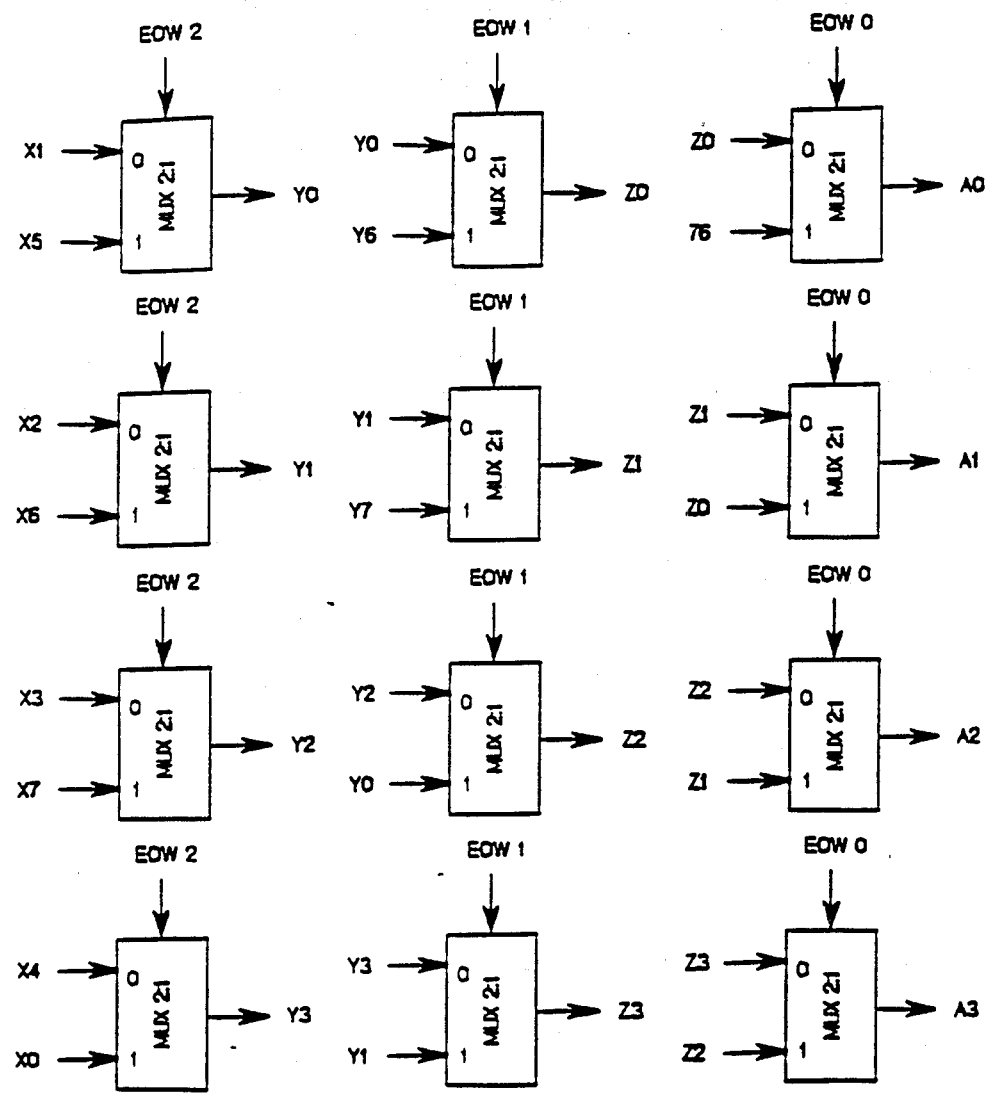
Figure 8C:
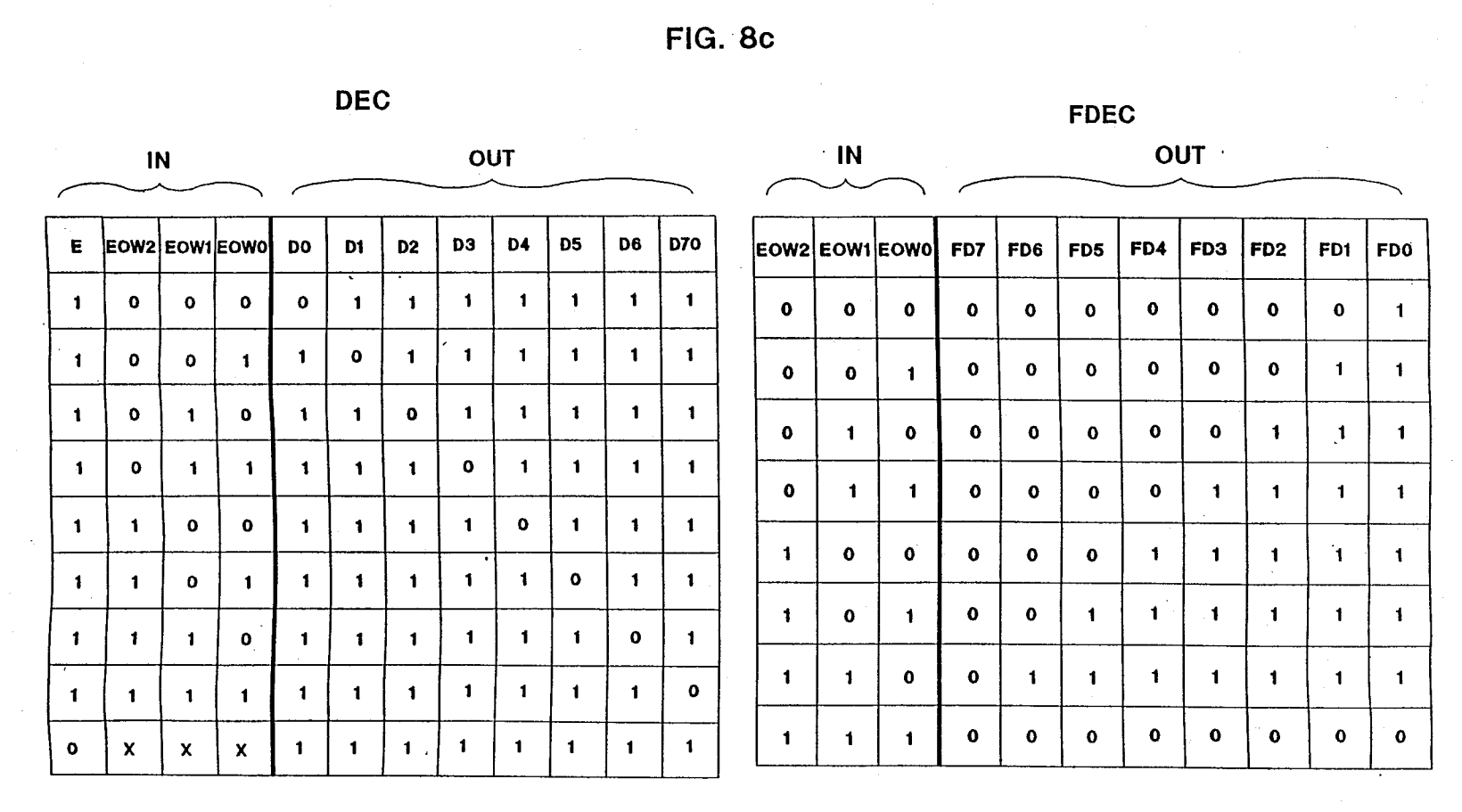

Through combining rotary (ROT: FIG. 8b), decoding (FDEC: FIG. 8c), the EOW information controls the generation of the 8 input x bits (INXY) vs. the output x bits (OUTXY).

The word expander

Figure 9A:
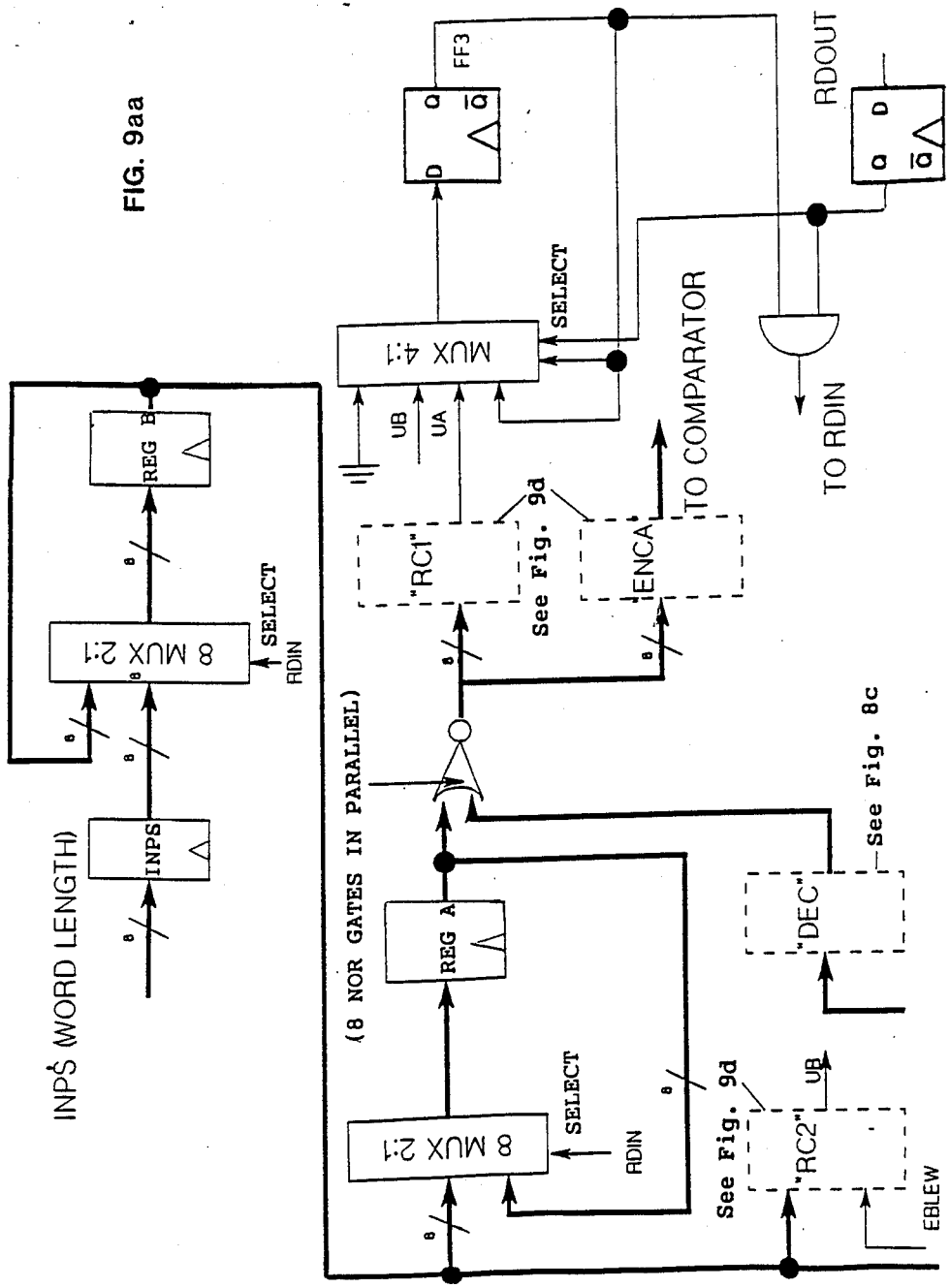
FIGS. 9aa and 9ab (together) constitute a schematic of an example of circuitry implementing the word expander.
Figure 9A:
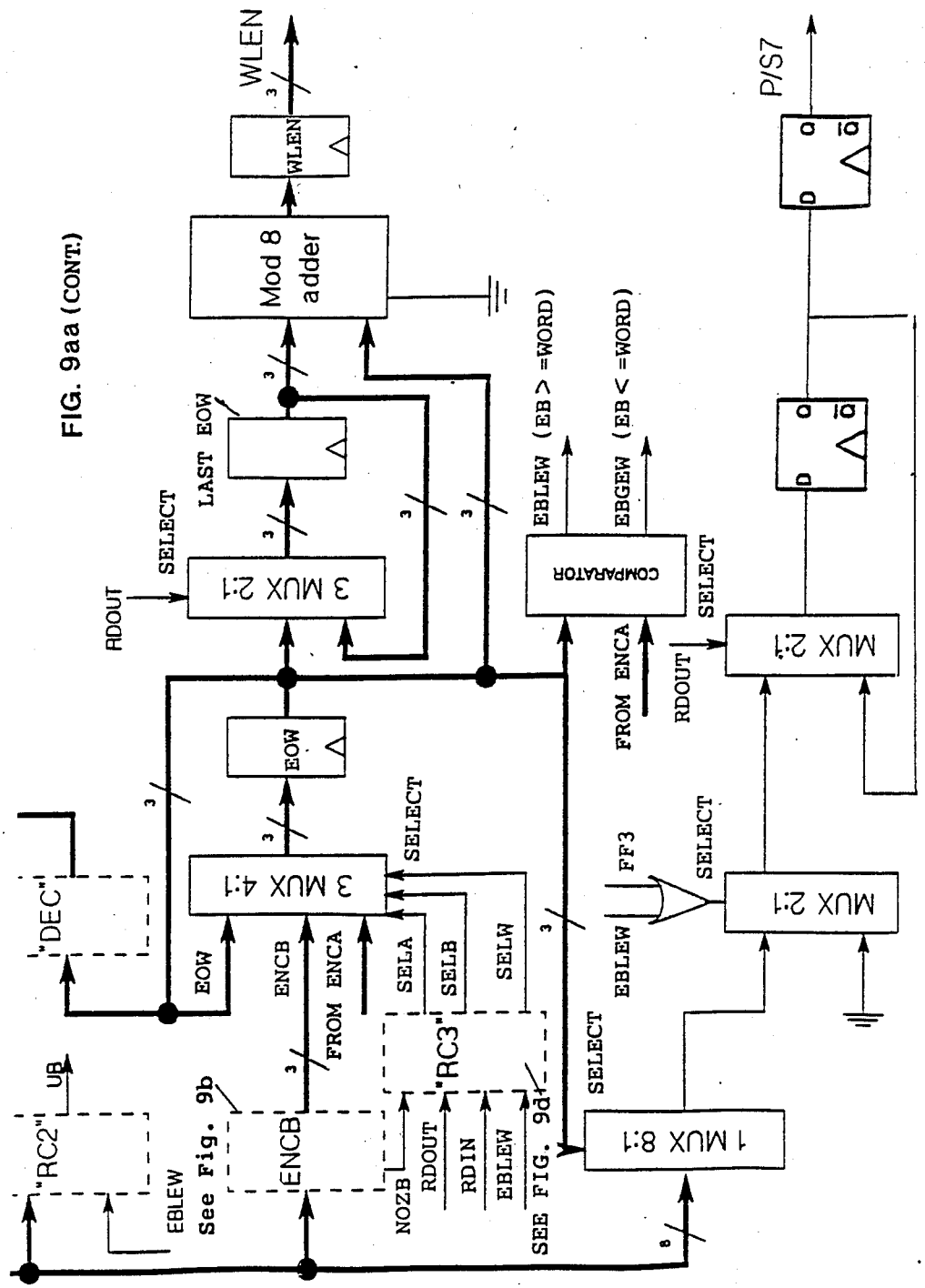
Figure 9A:
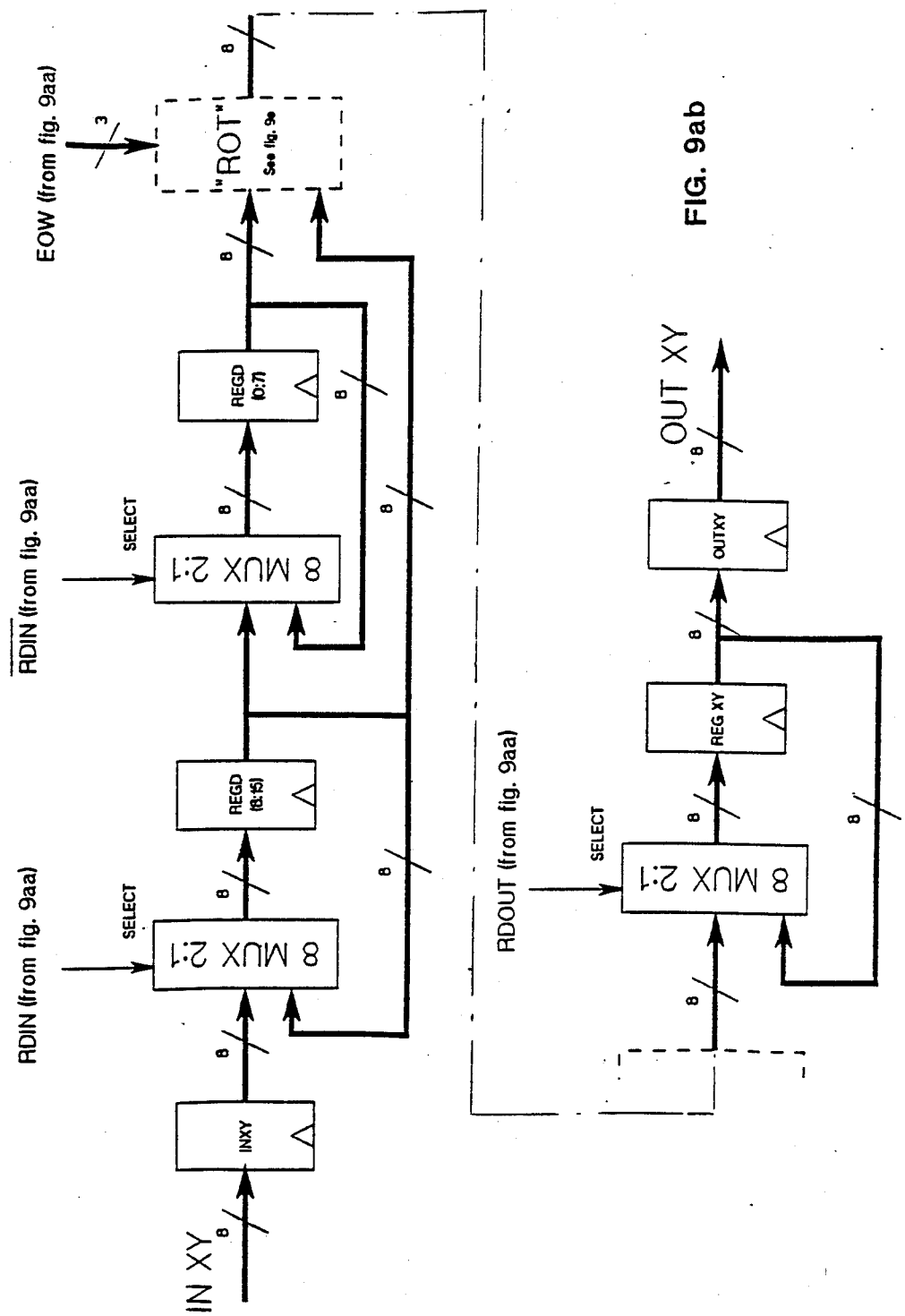

The electrical diagram of the word expander WE (in the case where N=M=16, ST=2) is shown in FIG. 9a.

Unlike the transmit end, the receive end is not provided with the two alternative solutions described for the word compacter WC, i.e. the word length information must always be computed from the incoming 2*M/ST ps bits (as in FIG. 7b).

A distinction always exists between a ps side and an x side: the ps side is much more complex with respect to the word compacter in that each packet can contain several compacted words (at least four) or a single word can span through two subsequent packets.

Therefore two counters (EOW/LASTEOW) are necessary and, at the same time, two registers (REGA, REGB) must be simultaneously examined through the EOW/LASTEOW registers contents and the DEC (FIG. 9c) combining network. In fact, they contain the ps bits belonging to two successive packets and gradually supply, through the combining ENCA/ENCB networks (FIG. 9b), the necessary word length information WLEN and P/S7 in output, whose meaning is the same as the signals input to the word compacter.

The whole circuit is developed only if single RDOUT (i.e. request of data by the output) is present.

An analogous signal RDIN (i.e. request of data to the input) is generated as a function of the RDOUT signal and of combining networks RC1, RC2 (FIG. 9d).

Figure 9E:
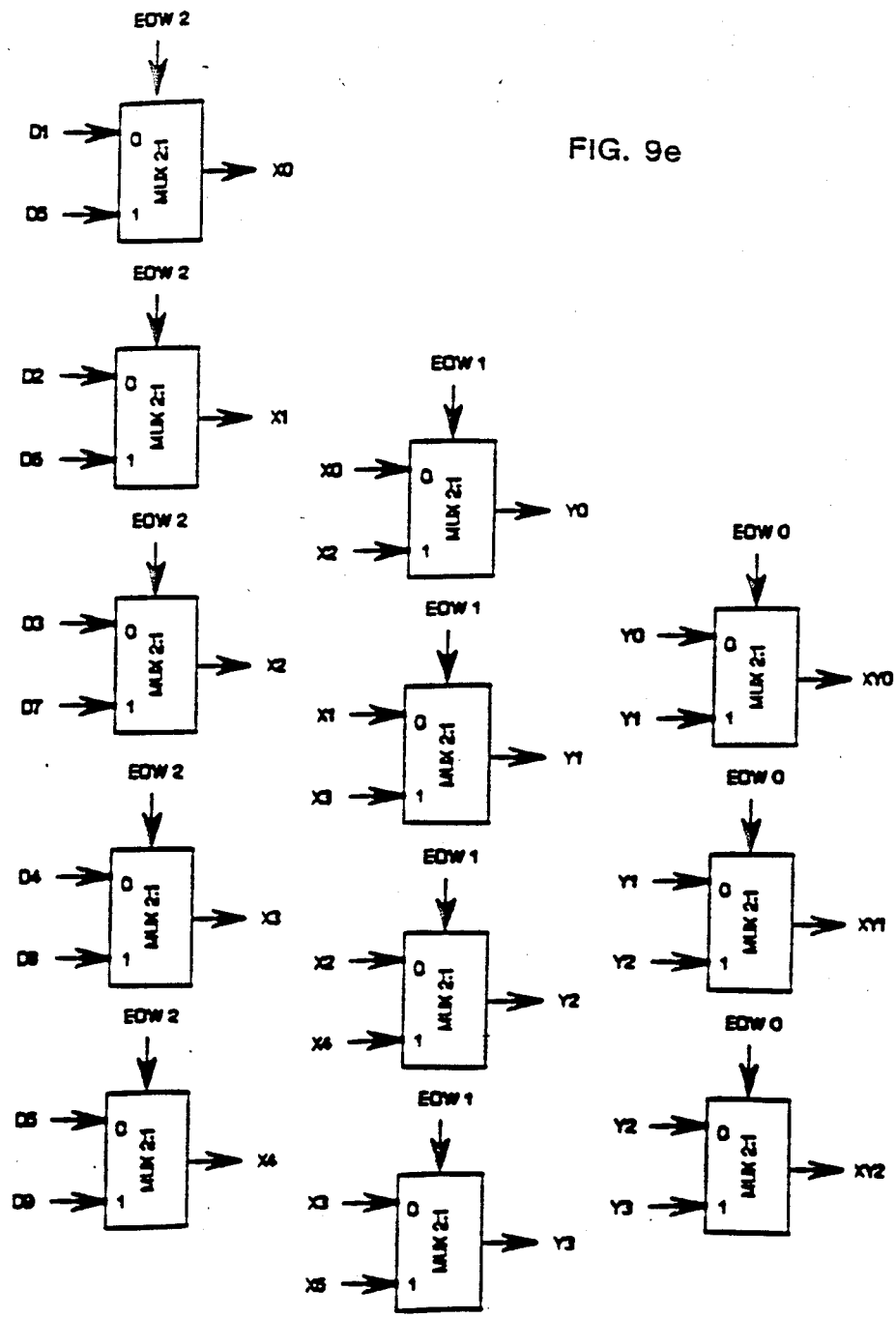

As in the word compacter, the x side develops as a function, besides the RDIN/RDOUT signals, of the EOW register contents and of the ROT combining network (FIG. 9e).

The output information format coincides with the information format at the input of the word compacter WC.

Although the present invention has been described in connection with a preferred embodiment thereof, many modifications and various thereof will now become apparent. It is preferred, therefore, that the present invention be limited not by the foregoing text, but only by the appended claims.

What is claimed is:

1. A variable length step code for use in a device which compacts words of digital data for high frequency transmission, comprising:
   (a) a variable number of prefixes, the number of prefixes being between 0 and N/ST, where N=the predetermined length of a word in terms of number of bits and ST=a constant positive integer submultiple of N; and
   (b) a suffix for signalling the end of a word, the only exception being for words of said maximum length N, which need not end with a suffix.

2. A variable length step code as recited in claim 1, wherein each of said prefixes and said suffix of said code have a length=ST, so that the length WL of each word is a multiple of ST in accordance with the equation WL=nST, where n is an integer greater than or equal to 1 and less than or equal to N/ST and the words are transmitted in packets with length M, M being a multiple of ST in accordance with the equation M=mST, where m is na integer greater than or equal to 1 and less than or equal to M/ST.

3. A device for implementing the variable length step code of claim 1 comprising, for transmitting words, a word compacter disposed between a coder and a buffer, said word compacter receiving said variable length words from said coder and transmitting packets of bits to said buffer having a constant length M by operating at a peak frequency=N/M*Fs, where Fs=the frequency of the input signal.

4. A device for implementing the variable length step code of claim 1, comprising, for receiving words, a extracter inserted between a buffer and a decoder, said word extracter receiving packets of bits having a constant length M from said buffer and transmitting to said decoder variable length words by operating at a peak frequency=N/M*Fs, where Fs=the frequency of the input signal.

5. A device as recited in claim 4, where N=M=16, ST=2, and words having said maximum length N need not end with a suffix.

* * * * *